United States Patent [19]
Gabric et al.

[11] Patent Number: 5,965,203
[45] Date of Patent: Oct. 12, 1999

[54] METHOD FOR DEPOSITING A SILICON OXIDE LAYER

[75] Inventors: Zvonimir Gabric, Zorneding; Oswald Spindler, Vaterstetten, both of Germany

[73] Assignee: Siemens Aktiengesellschaft, Munich, Germany

[21] Appl. No.: 08/643,599

[22] Filed: May 6, 1996

[30] Foreign Application Priority Data

May 5, 1995 [DE] Germany .............................. 195 16 669

[51] Int. Cl.$^6$ ..................................................... C23C 16/00
[52] U.S. Cl. ............................... 427/255.23; 427/255.37; 427/255.393
[58] Field of Search ........................ 427/255.23, 255.37, 427/255.395

[56] References Cited

FOREIGN PATENT DOCUMENTS

| 0 212 691 | 3/1987 | European Pat. Off. . |
| 0 239 664 | 10/1987 | European Pat. Off. . |
| 0 272 140 | 6/1988 | European Pat. Off. . |

*Primary Examiner*—Bernard Pianalto
*Attorney, Agent, or Firm*—Herbert L. Lerner; Laurence A. Greenberg

[57] ABSTRACT

A method for depositing a silicon oxide layer by ozone-activated gas phase deposition, uses tetraethyl orthosilicate (TEOS). An initially high gas flow ratio of TEOS to ozone is increasingly varied to a low steady-state ratio.

8 Claims, No Drawings

METHOD FOR DEPOSITING A SILICON OXIDE LAYER

BACKGROUND OF THE INVENTION

1. Field of the Invention

The invention relates to a method for depositing a silicon oxide layer.

Silicon oxide layers can be made by the so-called TEOS (tetraethyl orthosilicate) process, through the use of gas phase deposition (CVD—Chemical Vapor deposition). It is known that gas phase deposition is activated by the addition of ozone in a gas flow. A disadvantage of the ozone-activated TEOS process is different deposition characteristics which occur, depending on the base material. The deposition rate is thus lower on a thermal oxide than on silicon.

The publication by K. Fujino, Y. Nishimoto, N. Tokumasu and K. Maeda, entitled: Dependence of Deposition Characteristics on Base Materials in TEOS and Ozone CVD at Atmospheric Pressure, in J. Electrochem. Soc. Vol. 138, No. 2, February 1991, p. 550, proposes an improvement by initially depositing a first layer at a low ozone concentration and subsequently depositing a second layer to the desired layer thickness at a high ozone concentration. That process has the disadvantage of producing two separate layers, so that it is not possible to reliably prevent uneven deposition with the development of bubbles and/or fluctuations in stoichiometry. Moreover, the manipulation involved in the process is inconvenient since the deposition conditions must be setup anew for each of the two layers.

It is known from a publication by the same authors, that was published after the above-mentioned publication, and which is entitled: Surface Modification of Base Materials for TEOS/$O_3$ Atmospheric Pressure Chemical Vapor Deposition, in J. Electrochem. Soc. Vol. 139, No. 6, June 1992, p. 1690, to use a nitrogen or argon plasma in an ozone-activated silicon oxide gas phase deposition through the use of TEOS. Exposing surfaces to the nitrogen plasma levels off surface energies, so that uniform nucleation of the layer to be deposited can be attained for the ensuing actual TEOS process. When argon plasma is employed, the surface energies are achieved by eliminating the different surface constitution by sputtering off the nonhomogeneous layer. Those processes again produce defective layer quality and inadequate replicability, so that they cannot even be considered for use in production.

SUMMARY OF THE INVENTION

It is accordingly an object of the invention to provide a method for depositing a silicon oxide layer, which overcomes the hereinafore-mentioned disadvantages of the heretofore-known methods of this general type in an ozone-activated TEOS process.

With the foregoing and other objects in view there is provided, in accordance with the invention, a method for depositing a silicon oxide layer by ozone-activated gas phase deposition, using tetraethyl orthosilicate (TEOS), which comprises increasingly varying an initially high gas flow ratio of TEOS to ozone to a low steady-state ratio.

In accordance with another mode of the invention, there is provided a method which comprises initially setting the TEOS gas flow to a multiple of the ozone gas flow, and setting the ozone gas flow to a multiple of the TEOS gas flow in the steady-state ratio.

In accordance with a further mode of the invention, there is provided a method which comprises reducing the TEOS gas flow and increasing the ozone gas flow, beginning at initial conditions.

In accordance with an added mode of the invention, there is provided a method which comprises initially increasing the ozone-containing gas flow and keeping the TEOS gas flow constant, beginning at initial conditions.

In accordance with an additional mode of the invention, there is provided a method which comprises attaining the steady-state ratio of the gas flows after approximately one and one half minutes.

In accordance with yet another mode of the invention, there is provided a method which comprises continuously varying the gas flow ratio of TEOS to ozone.

In accordance with yet a further mode of the invention, there is provided a method which comprises varying the gas flow ratio of TEOS to ozone in stages.

In accordance with a concomitant mode of the invention, there is provided a method which comprises initially varying the gas flow ratios slowly and then increasingly varying the gas flow ratios nonlinearly.

Other features which are considered as characteristic for the invention are set forth in the appended claims.

Although the invention is illustrated and described herein as embodied in a method for depositing a silicon oxide layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following examples of specific embodiments.

DESCRIPTION OF THE PREFERRED EMBODIMENTS

Referring now to the examples of the invention in detail, it is noted that the invention attains a very homogeneous silicon oxide layer without fluctuations in stoichiometry by providing that at the beginning of a gas phase deposition, a gas flow ratio of TEOS to ozone is very high and subsequently is varied until a steady-state ratio is attained, in which the gas flow ratio of TEOS to ozone is low.

Typically, in an exemplary embodiment, the initial gas flow ratio of TEOS to the ozone-containing gas is approximately 10, while in the case of the steady-state gas flow ratio attained after approximately one and a half minutes, the value of 0.4 is attained.

Beginning with the initial gas flow ratio, it is advantageous initially to keep the TEOS gas flow constant and to increase the ozone gas flow. While subsequently the ozone gas flow is increased further up to its steady-state final value, the TEOS gas flow can be reduced down to its steady-state final value. The variation is therefore preferably effected nonlinearly, although a linear variation of the ratio is also possible.

By increasing the ozone gas flow, which is produced with an ozone generator, the proportion of oxygen in the entire gas flow also decreases simultaneously during this starting phase. This is shown in a first column of a table shown below with process parameters of an exemplary embodiment, while second and third columns indicate the gas flow of the ozone and TEOS, respectively. At a largely constant $O_2/O_3$ gas flow, the ratio of these two gases therefore varies from a low proportion of ozone to a high proportion of ozone.

The variation in the ratio of the initial gas flow conditions to the steady-state gas flow conditions is preferably carried out continuously, although in actual practice it is typically performed in stages over time. In order to improve the conditions required for desensitization of the deposition process, the initial gas flow ratio of TEOS to ozone is initially varied slowly, but then comparatively quickly until the steady-state final value. While the entire starting process until the steady-state final value is reached lasts about one and a half minutes, for about half of this total time the initial TEOS total flow is still constant, while the ozone-containing gas flow amounts to about two and a half times the initial value.

Overall, the ratio of the gas flows of TEOS to ozone at this point therefore still is approximately four. As a result of the contrary variations in the TEOS gas flow and the ozone gas flow that then ensue, the TEOS gas flow at the end of the starting process is reduced to about two-thirds of its initial value, while the ozone flow amounts to more than 15 times the initial gas flow.

The table below provides a survey of possible exemplary process parameters. Parameters which are not listed, such as pressure and temperature, match those of a known standard process, for example being approximately 600 Torr and approximately 400 C.

| Time | $O_2$ [sccm] | $O_3$ [sccm] | TEOS [sccm] |
|---|---|---|---|
| 15" | 5000 | 300 | 3000 |
| 11" | 5000 | 500 | 3000 |
| 18" | 5000 | 750 | 3000 |
| 15" | 5000 | 1000 | 2800 |
| 12" | 4000 | 2000 | 2600 |
| 9" | 3000 | 3000 | 2400 |
| 6" | 2000 | 4000 | 2200 |
| 3" | 1000 | 5000 | 2000 |

-continued

| Time | $O_2$ [sccm] | $O_3$ [sccm] | TEOS [sccm] |
|---|---|---|---|
| X" | — | 5000 | 2000 |

*sccm = standard cm³ of gas flow

We claim:

1. A method for depositing a silicon oxide layer by ozone-activated gas phase deposition, using tetraethyl orthosilicate (TEOS), which comprises steadily reducing an initially high gas flow ration of TEOS to ozone to a low steady-state ratio below 1.

2. The method according to claim 1, which comprises initially setting the TEOS gas flow to a multiple of the ozone gas flow, and setting the ozone gas flow to a multiple of the TEOS gas flow in the steady-state ratio.

3. The method according to claim 1, which comprises reducing the TEOS gas flow and increasing the ozone gas flow, beginning at initial conditions.

4. The method according to claim 1, which comprises initially increasing the ozone-containing gas flow and keeping the TEOS gas flow constant, beginning at initial conditions.

5. The method according to claim 1, which comprises attaining the steady-state ratio of the gas flows after approximately one and one half minutes.

6. The method according to claim 1, which comprises continuously varying the gas flow ratio of TEOS to ozone.

7. The method according to claim 1, which comprises varying the gas flow ratio of TEOS to ozone in stages.

8. The method according to claim 1, which comprises initially varying the gas flow ratios slowly and then increasingly varying the gas flow ratios nonlinearly.

* * * * *

UNITED STATES PATENT AND TRADEMARK OFFICE
CERTIFICATE OF CORRECTION

PATENT NO : 5,965,203
DATED : October 12, 1999
INVENTOR(S) : Zvonimir Gabric et al.

It is certified that error appears in the above-identified patent and that said Letters Patent is hereby corrected as shown below:

Column 4:

Line 13, "ration" should read --ratio--.

Line 14, after "steady-state ratio" cancel "below 1".

Signed and Sealed this

Fourteenth Day of November, 2000

Attest:

Q. TODD DICKINSON

*Attesting Officer*          *Director of Patents and Trademarks*